(12) United States Patent
Everaert et al.

(10) Patent No.: US 7,663,393 B2
(45) Date of Patent: Feb. 16, 2010

(54) MOBILITY MEASUREMENTS OF INVERSION CHARGE CARRIERS

(75) Inventors: Jean-Luc Everaert, Gooik (BE); Erik Rosseel, Grez Doiceau (BE)

(73) Assignees: IMEC, Leuven (BE); Semilab Semiconductor Physics Laboratory, Inc., Budapest (HU)

( * ) Notice: Subject to any disclaimer, the term of this patent is extended or adjusted under 35 U.S.C. 154(b) by 84 days.

(21) Appl. No.: 12/128,510

(22) Filed: May 28, 2008

(65) Prior Publication Data

US 2008/0297189 A1 Dec. 4, 2008

Related U.S. Application Data

(60) Provisional application No. 60/940,594, filed on May 29, 2007.

(30) Foreign Application Priority Data

Oct. 17, 2007 (EP) ................... 07118673

(51) Int. Cl.
G01R 31/26 (2006.01)
G01R 31/302 (2006.01)
(52) U.S. Cl. ...................... 324/765; 324/752
(58) Field of Classification Search ............. None
See application file for complete search history.

(56) References Cited

U.S. PATENT DOCUMENTS 5,442,297 A 8/1995 Verkuil 5,519,334 A 5/1996 Dawson

OTHER PUBLICATIONS

Schroder, Dieter K. "Surface voltage and surface photovoltage: history, theory and applications", Measurement Science and Technology, vol. 12, No. 3, Mar. 1, 2001, pp. R16-R31.
Son, et al., "Noncontact probing of metal-oxide semiconductor inversion layer mobility", Applied Physics Letters, AIP, American Institute of Physics, vol. 69, No. 12, Sep. 16, 1996, pp. 1779-1780.
Takagi, et al., "Experimental Evidence Of Inversion-Layer Mobility Lowering In Ultrathin Gate Oxide Metal-Oxide-Semiconductor Field-Effect-Transistors With Direct Tunneling Current", Japanese Journal of Applied Physics, vol. 41, Apr. 2002, pp. 2348-2352.
Faifer, et al., "Characterization of ultrashallow junctions using frequency-dependent junction photovoltage and its lateral attenuation", Applied Physics Letters, vol. 89, 151123, Oct. 13, 2006.
European Search Report dated May 7, 2008, for EP 07 11 8673.

*Primary Examiner*—Ha Tran T Nguyen
*Assistant Examiner*—Roberto Velez
(74) *Attorney, Agent, or Firm*—Knobbe Martens Olson & Bear LLP

(57) ABSTRACT

A method and device for determining the quality of the interface surface between a layer of a dielectric material and the top surface of the semiconductor substrate are disclosed. In one aspect, the method comprises providing a semiconductor substrate with a top surface whereon a layer of a dielectric material is deposited thereby forming an interface surface, the surface of the layer of the dielectric material being or not in direct contact with the semiconductor substrate defining a top surface. A charge is then applied on a dedicated area of the top surface. A voltage Vs is measured on the top surface. The dedicated area is illuminated to define an illuminated spot. The photovoltage is measured inside and outside the determined illuminated spot during the illumination of the area.

18 Claims, 7 Drawing Sheets

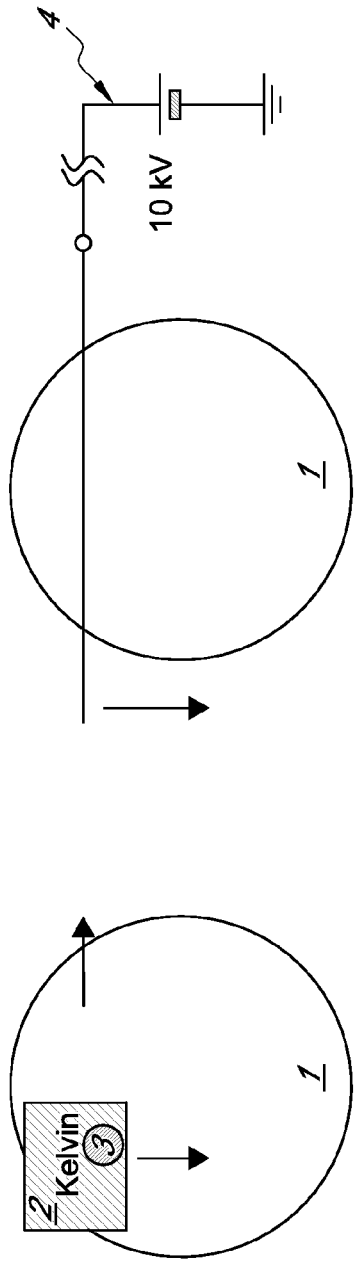
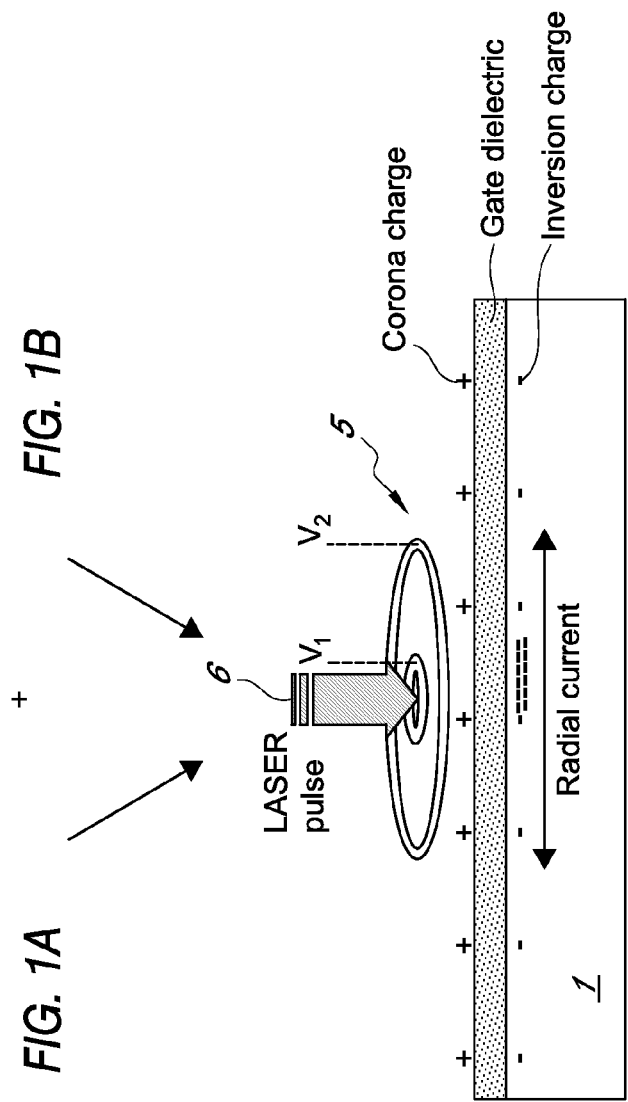
FIG. 1A
FIG. 1B
FIG. 1C

MOBILITY MEASUREMENTS OF INVERSION CHARGE CARRIERS

CROSS REFERENCE TO RELATED APPLICATIONS

This application claims priority under 35 U.S.C. §119(e) to U.S. provisional patent application 60/940,594 filed on May 29, 2007, which application is hereby incorporated by reference in its entirety.

BACKGROUND OF THE INVENTION

1. Field of the Invention

The present disclosure is related to the field of analytical measurements, more specifically it is related to a method for determination of the mobility of inversion charge carriers at the interface surface of a dielectric layer deposited on a semiconductor substrate.

More specifically, it relates to channel mobility measurements of the inversion charges situated at the interface surface of the gate dielectric and the (e.g. silicon) substrate.1.

2. Description of the Related Technology

It is well known that low field mobility of the inversion layer is one of the most important parameters that characterize metal-oxide-semiconductor field-effect transistors (MOSFETs). Attention must be paid that this parameter is well optimized in the gate stack module. However it is not very accessible to be measured, as the electrical characterization in state of the art techniques needs the fabrication of (expensive) transistors to extract it. This is still a hot topic within the CMOS research in trying to understand how different process conditions influence the mobility. Also for the extraction technique, different methods exist and are optimized for particular transistors, e.g. for the ultra thin gate dielectrics that show high leakage [Takagi S-I JJAP Vol 41 p.2348 (2002)].

An existing technique to derive mobility without making transistors is also described by [J. Son et al. Appl. Phys. Lett. 69 (1996) p. 1779]. However an important drawback of this technique is the fact that a polygate structure is needed and the fact that the free carriers are not moving due to an electric field parallel to the interface as it is in transistors.

In order to understand the impact on mobility, it would be good to have information immediately after only the (gate) dielectric deposition, excluding the impact of the metal gate or poly silicon gate (also referred to as gate electrode) which is in a completed gate stack situated above the (gate) dielectric material. On the other hand, for optimization, extended design of experiments (DOE) are necessary to find the ideal process parameters.

For this reason there is a need to extract mobility information from blanket wafers that contain a (gate) dielectric layer.

SUMMARY OF CERTAIN INVENTIVE ASPECTS

The present invention is related as a first aspect to a method of determination of the quality of the interface surface between a layer of dielectric material and the top surface of the semiconductor substrate comprising:

providing a semiconductor substrate with a top surface whereon a layer of a dielectric material is deposited thereby forming an interface surface, the surface of the layer of the dielectric material being or not in direct contact with the semiconductor substrate defining a top surface, applying a charge through discharge means on a determined area of the top surface, measuring a voltage Vs on the top surface, applying illumination means to the determined area, defining an illuminated spot, measuring during the illumination of the area the photovoltage inside and outside the determined illuminated spot by means of measuring means.

Preferred embodiments particularly related to a method to measure the mobility of inversion charge carriers at the interface surface of a dielectric layer which will define the gate layer with a substrate; namely preferred embodiments refer in this application to the channel mobility measurement.

The method comprises the combination of at least two measurement modules or devices, more specifically the combination of a first module able to apply a corona charge on a specific area on the interface surface and measuring the related surface voltage (referred to as Q-V module) and of a second module (referred to as the junction photovoltage module or JPV module), applying a laser pulse at a fixed frequency leading to an illuminated spot within the specific area and subsequently measuring the induced photovoltage ($V_1$) inside and ($V_2$) outside respectively the illumination spot by means of two electrodes.

The two electrodes measuring the voltages are preferably concentric or at least partly concentric. Alternatively the electrodes can be linear (in case the laser spot is a concentric spot). The mobility is then derived from the sheet resistance (sheet resistance is inversely proportional to the mobility), that itself derives from the induced photovoltage ($V_1$) and ($V_2$) measured respectively inside and outside the illumination spot.

By illuminated spot, it should be understood a small area defined by receiving a certain amount energy from a laser.

By corona charge it should be understood as creating ionized molecules by corona discharge effect (by applying high voltage between a sharply curved electrode and the ground exceeding the Corona Inception Voltage of the charger assembly).

The method preferably starts with the process of applying a corona charge on the (gate) dielectric layer to create an inversion charge layer and the corresponding surface potential is then measured preferably contactless using a Kelvin probe through a Q-V module. Then a measurement performed with the JPV module is used to determine the sheet resistance of the inversion charge. This sheet resistance is inversely proportional to the mobility of the inversion charges. So a curve in which mobility is plotted in function of dielectric field can be derived.

The process of applying a corona charge is preferably performed over the entire substrate (wafer) by passing a metallic (e.g. tungsten) wire at a fixed potential (e.g. 10 kV) over the substrate surface. Alternatively and also preferred the Q-V corona charge is deposited locally by using a corona jet. In the corona jet, airflow blows out ions generated in an assembly consisting of a sharp needle centered in a tube which blows corona charge on the substrate surface locally on an (approximately 1 cm$^2$) specific area. The related surface voltage Vs (at least on the specific area) is preferably measured contactless using a Kelvin probe.

A Kelvin probe can be defined as a vibrating electrode (~0.5 cm$^2$ area) positioned over the surface forming a capacitor. If the voltage applied to the electrode is equal to the surface voltage the AC current flow has its minimum providing a way to measure the surface voltage in a non-contact way (the specific Kelvin probe is made by Trek, Inc).

The process of measuring the resistivity of the (corona) charge under the (gate) dielectric layer is performed using the JPV module. The JPV module is preferably used with a laser pulse that creates electron-hole pairs in the underlying (Si or Ge) substrate. On p-type silicon substrate an excess amount of electrons is created locally in the inversion layer near the interface surface of the (gate) dielectric layer and the (Si) substrate. Due to the charge gradient an electric field parallel to the interface surface will spread out the excess charges radially in parallel to the interface surface. By applying a laser pulse at a fixed frequency, an illuminated spot is created.

By using two at least partly concentric electrodes whereby one electrode ($R_1$) is situated within the illuminated spot and one electrode ($R_2$) is situated outside the illuminated spot, the induced photovoltage $V_1$ (originating from $R_1$) and $V_2$ (originating from $R_1$) can be derived. The at least partly concentric electrodes can have a ring structure. The voltages $V_1$ and $V_2$ respectively are measured preferably contactless by the electrodes $R_1$ and $R_2$ respectively.

Alternatively and also preferably, the electrodes can be linear electrodes e.g. finger shape electrodes.

The measurement of the voltages $V_1$ and $V_2$ originating from the at least partly concentric electrodes is performed contactless.

The method which combines JPV measurements with corona voltage deposition can be repeated with different surface voltages Vs such that a sheet resistance mapping system is created capable of defining mobility maps in the inversion layer directly following dielectric deposition. This new mobility mapping method makes it possible to characterize the (gate) dielectric material on a blanket substrate (e.g. Si wafer) excluding the impact of a metal gate or poly silicon gate (also referred to as gate electrode) which is in a completed gate stack situated above the (gate) dielectric layer.

According to preferred embodiments, the process of applying a corona charge is applied over the entire surface of the substrate by passing a metallic (e.g. tungsten) wire over the wafer, the wire is at a fixed voltage e.g. about 10 kV.

By passing, it can be suggested a constant speed linear movement according to X and Y directions, obviously any other movement should also be convenient. The speed of the displacement of the means creating the corona charge (a metallic wire or corona jet) will create the formation of the corona charges of the required charge density (i.e. electric field).

The speed is determined by the current of charge deposition and the required electric field and varies between about ~0.01-20 cm/s.

Alternatively, the process of applying a corona is applied locally on a dedicated area by using a corona jet, which blows corona charge on the wafer surface locally on about ~1 cm² area.

According to preferred embodiments, the process of measuring the surface voltage Vs at least locally on a dedicated area is performed using a Kelvin probe, most preferred the measurement is contactless.

According to preferred embodiments, the process of creating an excess amount of inversion charges (electrons for p-type silicon, holes for n-type silicon) at least locally on a dedicated area onto the substrate is performed using a laser pulse which creates electron hole pairs in the substrate underneath the at least one (gate) dielectric layer such that an excess amount of the inversion charges is created locally in the inversion layer near the interface surface of the at least one (gate) dielectric layer and substrate.

According to preferred embodiments, the process of measuring the photovoltage inside and outside the illuminated spot by means of two at least partly concentric electrodes is performed using the Junction PhotoVoltage module. The basis of the JPV measurement is to use photo excitation of charge carriers and to monitor in a spationally resolved manner the JPV signals inside and outside the illumination spot.

The method solves the problem of measuring the mobility of charge carriers at the interface surface of at least one layer without the need to fabricate a real expensive working device or transistor (comprising the dielectric layer) to predict the mobility of the carrier.

According to preferred embodiments, the substrate is a flat substrate such as e.g. a silicon (Si) or germanium (Ge) wafer. The substrate can also be a SOI (Silicon-On-Insulator) or a GOI (Germanium-On-Insulator) substrate which is basically a silicon (germanium) wafer with a thin layer of oxide (e.g. $SiO_2$) buried on it as dielectric layer. The substrate can be cleaned prior to the process of depositing a dielectric layer to remove contaminants. Optionally the substrate can be doped to obtain e.g. a p-doped or n-doped substrate (comparable to well implants in real devices).

According to another preferred embodiment, the at least one dielectric layer is a gate dielectric layer or a combination of gate dielectric layers (for example a "dual dielectricum"). Preferred examples of dielectric materials are high-k dielectric materials such as $SiO_2$ layers, SiN, SiON, $HfO_2$ or other metallic oxides such as $ZrO_2$, $Al_2O_3$, $La_2O_3$, $Pr_2O_3$, $Ta_2O_5$, ... and also the related silicates of these metals. Namely high k dielectric materials are materials having a k constant higher than 3.9 used as a reference, which is the k constant of $SiO_2$ material, and preferably higher than 8.

According to another preferred embodiment, the substrate comprising the at least one deposited dielectric layer (e.g. gate) may be heated or cooled during the measurements in order to measure the mobility as a function of temperature.

According to another preferred embodiment, the substrate comprising the at least one deposited layer (e.g. gate) may be mechanically stressed during the measurements in order to measure the mobility as a function of mechanical stress, being compressive or tensile.

The method can also be applied to predict the influence of capping layers and/or nitridation of the at least one (gate) dielectric layer on the mobility of a charge carrier. Therefore an extra layer can be deposited onto the at least one (gate) dielectric layer.

According to preferred embodiments, the process of depositing at least one (gate) dielectric layer is performed using deposition techniques such as Chemical Vapor Deposition (CVD), Metal Organic Chemical Vapor Deposition (MO-CVD), Atomic Layer Deposition (ALD), ...

Alternatively the at least one dielectric layer is formed by oxidation of the substrate (top side) using e.g. a thermal anneal, ... An example of such a layer is a $SiO_2$ layer formed on the wafer substrate.

Optionally a forming gas anneal process can be applied onto the at least one (gate) dielectric layer.

Preferred embodiments are related to a device for determining the mobility of inversion charges at the interface surface of a semiconductor substrate and a deposited layer, preferably a dielectric layer, such device comprising:

a substrate holder for holding the substrate comprising at least one deposited layer,
  a means for applying a corona charge onto the substrate, the means for applying the corona charge being designed to at least locally induce a surface voltage Vs on a specific area,
  a means for determining a parameter indicative for the surface voltage, a means for illuminating locally the surface of the substrate comprising the deposited layer and in particular the specific area to create an illuminated spot, a means having two at least and preferably partly concentric electrodes whereby a first electrode is situated within the illuminated spot and a second electrode is situated outside the illuminated spot, a means to measure the (photo)voltage, $V_1$ and $V_2$ respectively, of the first and second electrodes to calculate a parameter indicative for the sheet resistance from which the mobility of the inversion charges at the interface surface of a substrate and a deposited layer can be derived.

According to a preferred embodiment, the means for applying a corona charge comprises a metallic wire (e.g. a tungsten wire) at a fixed voltage (e.g. 10 kV) which is passed over the substrate (contactless).

According to another preferred embodiment, the means for applying a corona charge is a corona jet which blows corona charges onto the substrate surface.

According to another preferred embodiment, the means for determining the surface voltage is a Kelvin probe (contact less).

According to a preferred embodiment, the means for applying a corona charge and the means for determining the surface voltage (Kelvin probe) are situated in one module, also referred to as a corona charge voltage (Q-V) module.

According to a preferred embodiment, the means for illuminating at least locally the surface of the substrate (e.g. to generate an excess of electrons) is a laser having preferably a fixed frequency.

According to a preferred embodiment, the means for measuring the photovoltage by means of two at least preferably partly concentric electrodes and the means for illuminating locally the surface of the substrate comprising the deposited layer to create an illuminated spot are situated in one module, also referred to as a Junction PhotoVoltage (JPV) module.

According to a preferred embodiment, the means for measuring the photovoltage is performed using two ring electrodes whereby the laser beam is located inside the first ring electrode such that the diameter of the illuminated spot is at least extending the diameter of the first ring electrode and whereby the diameter of the second ring electrode is larger than the diameter of the illuminated spot (the second ring is situated outside the illuminated spot).

BRIEF DESCRIPTION OF THE DRAWINGS

Exemplary embodiments are illustrated in referenced Figures of the drawings. It is intended that the embodiments and Figures disclosed herein are to be considered illustrative rather than restrictive.

FIG. 1A is a schematic diagram showing the box which contains the Kelvin probe (which is moved in x-y axis directions).

FIG. 1B is a schematic diagram showing the tungsten wire moving across above the wafer surface. The speed determines the amount of corona charges deposited.

FIG. 1C is a schematic presentation of the JPV module according to a preferred embodiment.

DETAILED DESCRIPTION OF CERTAIN INVENTIVE EMBODIMENTS

Figure 2:
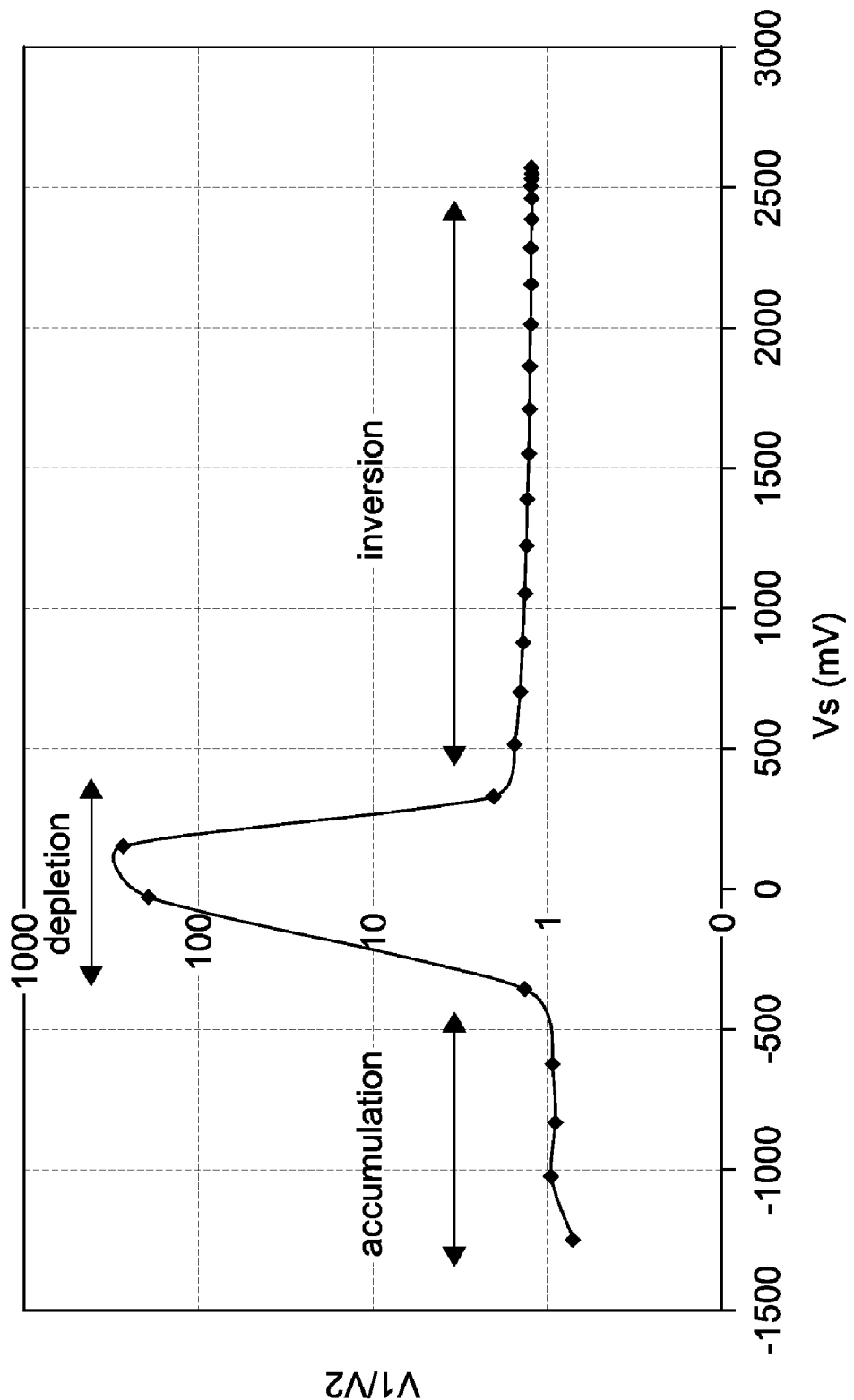
FIG. 2 shows a general JPV curve in function of surface voltage on a 4 nm $SiO_2$ gate dielectric. The curve illustrates $V_1/V_2$ in function of the surface voltage, from which the vertical electric field over the dielectric layer can be derived (on a p-type Si substrate). It shows a peak due to the depletion region, in which very low free carrier concentration is available at the interface surface. At left from the peak resistivity is low due to free hole conduction in accumulation. At right from the peak free electron in the inversion layer control the sheet resistivity.

Preferred embodiments will be described with respect to particular embodiments and with reference to certain drawings but the invention is not limited thereto but only by the claims.

Certain embodiments suggest a quick and cheap method to determine the mobility of inversion charge carriers situated at the interface surface between a dielectric layer and the substrate, in other words to perform channel mobility measurements.

Certain embodiments disclose a method able to screen (gate) dielectric materials before implementing them into transistors, as well as to understand relations process conditions towards mobility.

Certain embodiments suggest a method which is able to perform inline metrology (during process flow) and mapping of (gate) dielectric materials such as high-k materials.

Certain embodiments disclose a method able to measure inversion layer mobility immediately after (gate) dielectric growth or deposition and prior to metallization process, gate electrode deposition and/or metal gate formation, Certain embodiments disclose a method which will be an aid to the selection and process optimization of new gate dielectric materials and also for quality process control in manufacturing.

Certain embodiments avoid the high cost of transistor fabrication for characterization the mobility of inversion charge carriers.

Certain embodiments disclose a link between real process conditions and mobility and in particular to have a precise insight to the physics of mobility.

Preferred embodiments will be described with respect to mobility measurements of inversion charge carriers at the gate dielectric interface surface, although particularly useful for such characterization of (gate) dielectric layers such as novel high-k layers, is not limited thereto. The drawings described are only schematic and are non-limiting. In the drawings, the size of some of the elements may be exaggerated and not drawn on scale for illustrative purposes. The dimensions and the relative dimensions do not correspond to actual reductions to practice. It will be appreciated that there are numerous variations and modifications possible. Accordingly, the description should not be deemed to be limiting in scope.

It is to be noticed that the terms "inversion charge carriers" and "inversion charges" are used next to each other in the following description and refer to minority charge carriers attracted by an electric field towards the interface surface between (gate) dielectric layer and (e.g. silicon) substrate and no distinction is intended to be made throughout the description. Alternatively also accumulation charge mobility can be measured using the method of one embodiment.

The method of one embodiment is applicable to the dielectric layer(s) (e.g. gate dielectric) which are deposited or formed onto a flat substrate to create inversion charge carriers after applying a corona voltage to the dielectric layer(s) and subsequently determine the mobility of the inversion charge carriers at the interface surface of the dielectric layer and the substrate.

Method for Determining Mobility of Inversion Charges of Gate Dielectrics

A method for the determination of the mobility of inversion charge carriers is disclosed. The inversion charge carriers are situated at the contact surface of a deposited or grown layer and the substrate onto which the layer is deposited. The inversion charge carriers are created by applying at least locally a corona charge onto the top surface of the deposited layer. Preferably the deposited layer(s) is a dielectric layer such as a gate dielectric layer and the method is used to determine the influence of the gate dielectric layer on the mobility of inversion charge carriers in the layer underneath or the substrate underneath.

Preferably the substrate is a Si (or Ge) substrate which can be p-type or n-type doped. Alternatively the substrate is a Si (Silicon-On-Insulator) or a GOI (Germanium-On-Insulator) substrate which is basically a silicon (germanium) wafer with a thin layer of oxide (e.g. $SiO_2$) buried in it.

Preferably the dielectric layer is a gate dielectric layer such as Hf based materials such as $HfO_2$ and other metal-oxides (such as $ZrO_2$, $Al_2O_3$, $La_2O_3$, $Pr_2O_3$, $Ta_2O_5$, ...) and also the related silicates of these metals. The method can also be applied to conventional used gate dielectric layers (e.g. SiO2 for use as reference material) and to combinations of gate dielectric layers (referred to as dual dielectric layers, ...).

Measuring Mobility of Inversion Charges of Gate Dielectrics

According to a preferred embodiment, the measurement is a combination of three techniques or methods. The first technique is used to deposit a corona charge onto the (gate) dielectric layer and is preferably performed by passing a metallic (tungsten) wire at 10 kV over the surface of the gate dielectric as shown in FIG. 1B. The second technique is used to measure the surface voltage Vs and is preferably performed using a Kelvin probe as shown schematically in FIG. 1A. The third technique is used to create an illuminated spot and measure the related photovoltage by means of the junction photovoltage (JPV) method as shown in FIG. 1C.

Preferably the JPV technique comprises the use of a laser which creates pulses to induce electron-hole pairs in the substrate underneath the gate dielectric. When biased in inversion on for example a p-type Si substrate, an excess amount of electrons is created locally in a layer defined as the inversion layer near the gate dielectric layer wherein and (Si) substrate interface. Due to the charge gradient an electric field parallel to the interface surface will spread out the excess charges radially in parallel to the interface surface according to following equation (1):

$$\left(\frac{\partial U}{\partial r}\right) = -I\left(\frac{R_s}{2r\pi}\right) \quad (1)$$

In which U is the photovoltage measured using the JPV measurement technique at a certain distance r from the laser impact. I is the radial current and $R_s$ is the sheet resistance which is related to mobility µ according to following equation (2):

$$\frac{1}{R_s} = Q_{inv} \cdot \mu \quad (2)$$

in which $Q_{inv}$ is the inversion charge per unit area analog to the field effect transistors according to following equation (3):

$$I_{DS} = \mu_{eff} \cdot \frac{W}{L} \cdot Q_{inv} \cdot V_{DS} \quad (3)$$

In which $I_{DS}$ is the source-drain current, W is the channel width, L is the channel length and $Q_{inv}$ is the inversion charge in the channel.

By repeating the above sequence the bias can be varied from accumulation over depletion into inversion as shown in FIG. 2.

In a pulsed laser regime with a certain frequency, $V_1$ and $V_2$ are capacitively picked up by two at least partly concentric electrodes (e.g. ring electrodes (as shown in FIG. 1C) wherein $V_1$ is the potential of the inner (ring) electrode and $V_2$ is the potential of the outer (ring) electrode. The potential difference (ratio) between $V_1$ and $V_2$ and the phase difference is a measure for the sheet resistance, the resulting sheet resistance can be derived by approximation from following equation (4):

$$R_s \sim \frac{V_1}{V_2} \quad (4)$$

FIG. 2 shows $V_1/V_2$ in function of the vertical electric field over the gate dielectric on a p-type Silicon substrate. It shows a peak due to the depletion region, in which very low free carrier concentration is available at the interface surface. At left from the peak resistivity is low due to free hole conduction in accumulation. At right free electron in the inversion layer control the sheet resistivity.

The calculation for the mobility can be performed from the JPV measurement in particular VQ measurements give $V_b$, $V_{fb}$, $V_s$, EOT.

$V_b$: band bending $V_{fb}$: flat band voltage $V_s$: surface voltage

EOT: equivalent oxide thickness

With spectroscopic ellipsometry, the thickness of the gate dielectric is measured:

$T_{gd}$.

The voltage over the gate dielectric is determined by $V_{gd} = V_s - V_{fb} - V_b$ So the electric field over the gate dielectric is $$F_{gd} = \frac{V_{gd}}{T_{gd}}$$

The inversion charge induced by the field is:

$$Q_{inv} = k_{gd} \cdot \epsilon_0 \cdot F_{gd}$$

with $\epsilon_0$ the permittivity and $k_{gd}$ the dielectric constant of the gate dielectric, being $$k_{gd} = \frac{T_{gd}}{EOT} k_{SiO_2}$$

so that $$Q_{inv} = \frac{k_{SiO_2} \cdot \varepsilon_0 \cdot V_{gd}}{EOT}$$

which allows $Q_{inv}$ to be expressed in quantities that are directly measured by VQ.

From JPV measurements $V_1$ and $V_2$ are measured for which [Faifer et. al., APL. 89, 151123 (2006)]:

$$\frac{V_1}{V_2} = \left[1 - \frac{2}{kr_0} \frac{I_1(kr_0)K_1(kr_0)}{I_0(kr_0)K_1(kr_0) + I_1(kr_0)K_0(kr_0)}\right]$$

$$\frac{kr_0^2}{2} \frac{I_0(kr_0)K_1(kr_0) + I_1(kr_0)K_0(kr_0)}{I_1(kr_0)[r_1 K_1(kr_1) - r_2 K_1(kr_2)]}$$

where $r_0$, $r_1$ and $r_2$ are the radius of inner electrode, inner radius of outer electrode and outer radius of outer electrode and where $I_0(z)$, $I_1(z)$, $K_0(z)$ and $K_1(z)$ are the modified Bessel functions and assuming no leakage:

$$k = \sqrt{i2\pi f R_s C_{inv}}$$

with f the JPV frequency and $C_{inv}$ the capacitance in inversion.

From this $R_s$ can be determined after measuring $V_1$ and $V_2$.

From these formula the sheet resistance Rs can numerically be solved. Mobility is then derived with $$\mu = \frac{1}{R_s Q_{inv}}$$

This can be done for each inversion bias resulting in a mobility-field graph. If the gate dielectrics are grown on the same type of wafers, having identical doping conditions, mobility comparisons can be made. Obviously, $SiO_2$ is taken as the reference (gate) dielectric layer.

Figure 3:
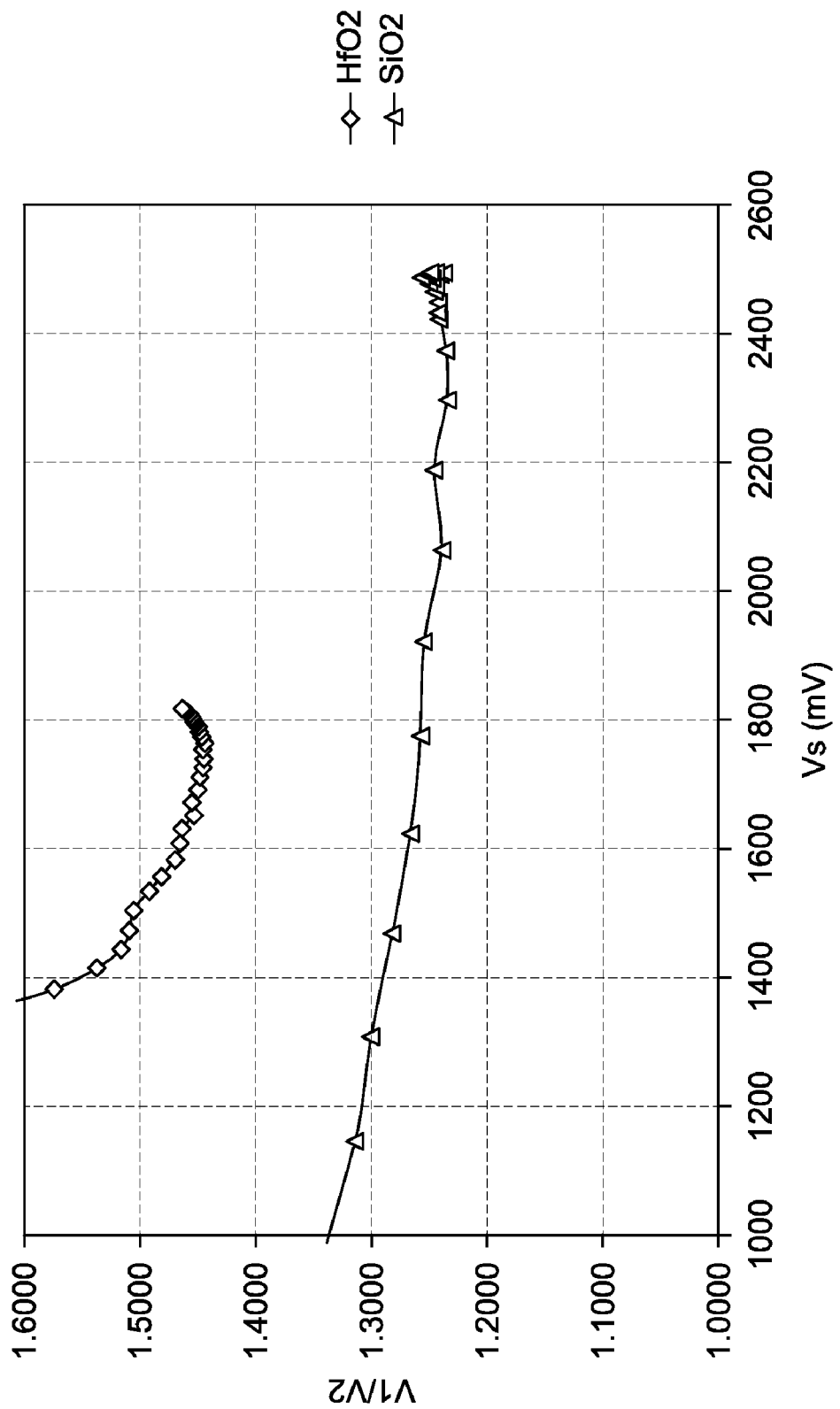
FIG. 3 shows a JPV curve in function of surface voltage for a 4 nm $SiO_2$ and for a 4 nm $HfO_2$ layers deposited on a p-type silicon substrate.

FIG. 3 shows a minimum in Rs indicating mobility peaks at a certain field value. This is generally known phenomenon which is also observed in transistor analysis.

FIG. 3 represents the curve $V_1/V_2$ lowest for $SiO_2$ in inversion, and by consequence mobility is shown to be higher for $SiO_2$ than $HfO_2$.

Figure 4:
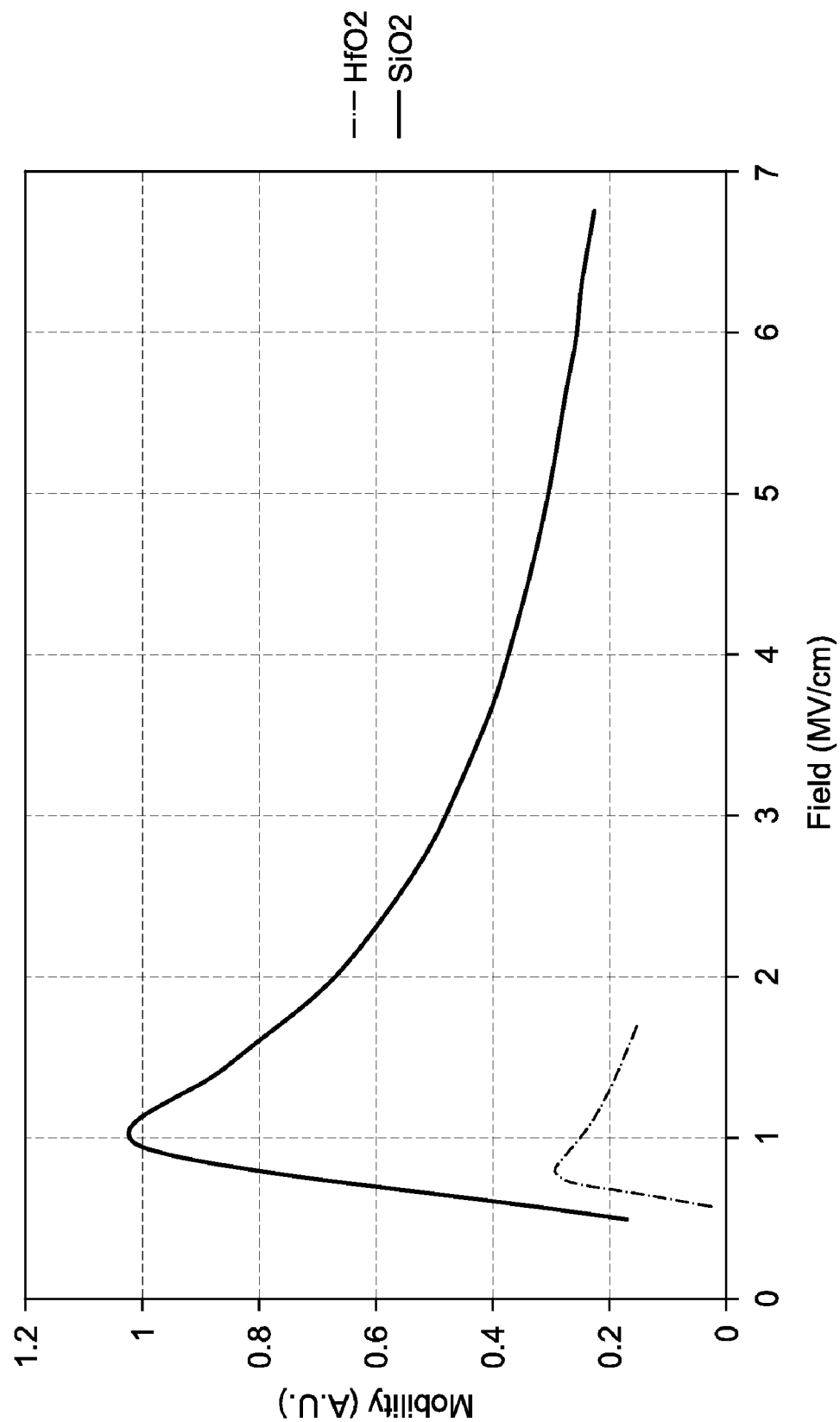
FIG. 4 shows the mobility in function of the electric field for the same wafers as in FIG. 3.

From FIG. 4 whereon the mobility has been calculated in function of the field (MV/cm), it is also clear that $HfO_2$ shows a reduction in mobility as compared to $SiO_2$.

Also this is in agreement with transistor data. It also reflects the typical problem of High k gate dielectric materials in reduced mobility, which is a hot topic in CMOS research nowadays.

FIG. 4 shows the mobility (A.U.) in function of the field (MV/CM) for a 4 μm $SiO_2$ and for a 4 μm $HfO_2$ layers deposited on a p-type silicon substrate.

System For Measuring Mobility of Inversion Charges of Gate Dielectrics

One embodiment also includes a system for determining the mobility of inversion charge carriers at the interface surface of a (gate) dielectric and substrate underneath. The system comprises at least a substrate holder for holding the substrate comprising a gate dielectric (layer), a module for applying at least locally a corona charge onto the gate dielectric to at least locally induce a surface voltage, a module for determining a parameter indicative for the surface voltage, a module for generating an excess of electrons at least locally and a module for measuring the sheet resistance at least locally.

FIG. 1B represents a set-up used to apply a corona charge onto the surface of the gate dielectric layer 1. In such a set-up a metallic wire 4 (e.g. tungsten) is moved across the surface of the gate dielectric 1 and the speed of the movement determines the amount of corona charge deposited.

According to certain embodiments, the means for applying a corona charge is a corona jet which blows corona charge onto the whole surface of the gate dielectric.

FIG. 1A represents a set-up used to determine the surface voltage locally by moving a Kelvin probe across the surface of the substrate.

FIG. 1C represents a set up for the Junction PhotoVoltage comprising a pulsing laser and two at least partly concentric (circular) electrodes.

In one embodiment, the above mentioned techniques and set-ups are combined in one and the same tool. This means that a Q-V module which is able to apply a corona voltage and subsequently measure the related surface voltage is combined with a JPV module which is able to induce a laser pulse at a certain frequency in the frequency range 1 Hz-1 MHz and measure the photovoltage using at least two at least partly concentric electrodes.

Figure 6:
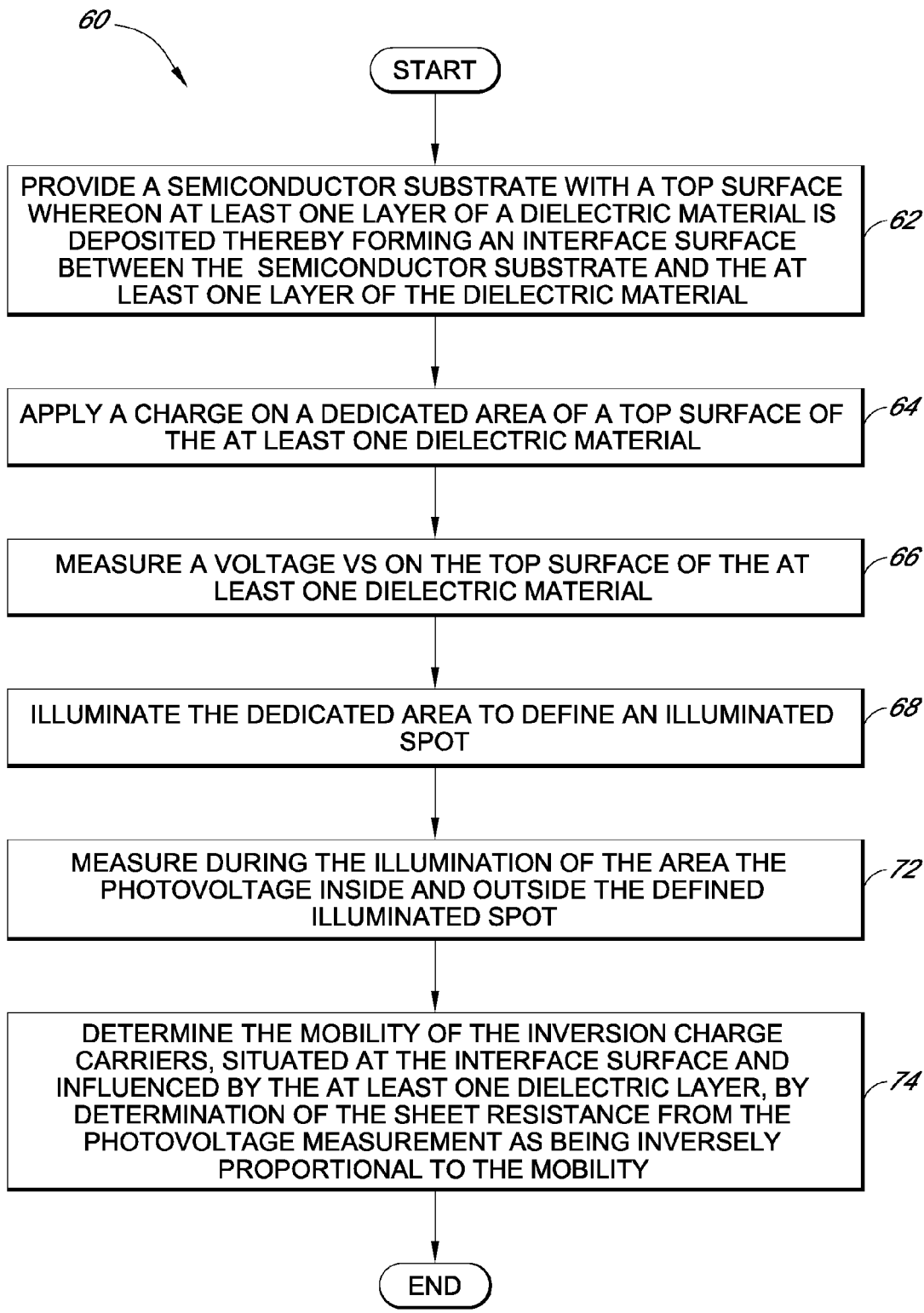
FIG. 6 shows a flowchart of one embodiment of a method of determining mobility of inversion charge carriers situated at an interface surface between at least one layer of a dielectric material and a top surface of a semiconductor substrate.

FIG. 6 shows a flowchart of one embodiment of a method of determining mobility of inversion charge carriers situated at an interface surface between at least one layer of a dielectric material and a top surface of a semiconductor substrate. The method may be performed by, for example, a device described throughout this description. The method 60 starts a block 62, wherein a semiconductor substrate is provided with a top surface whereon at least one layer of a dielectric material is deposited thereby forming an interface surface between the semiconductor substrate and the at least one layer of the dielectric material and a top surface of the at least one dielectric material. Next to a block 64, a charge is applied on a dedicated area of the top surface of the at least one dielectric material. Moving to a block 66, a voltage Vs on the top surface of the at least one dielectric material is measured. Next at a block 68, the dedicated area is illuminated to define an illuminated spot. Moving to a block 72, the photovoltage inside and outside the defined illuminated spot is measured during the illumination of the area. Next at a block 74, the mobility of the inversion charge carriers, situated at the interface surface and influenced by the at least one dielectric layer, is determined by determination of the sheet resistance from the photovoltage measurement as being inversely proportional to the mobility.

Figure 7:
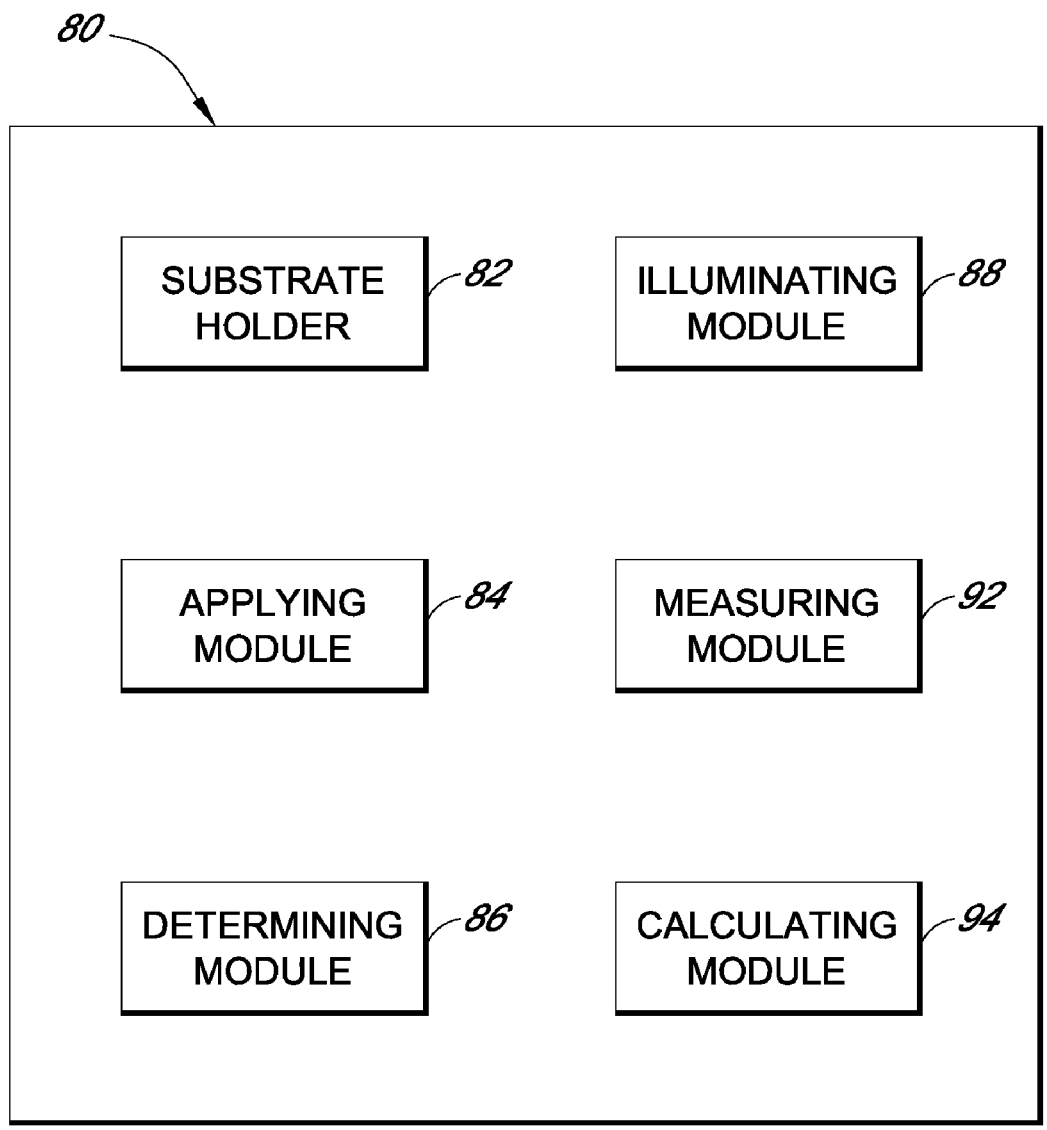
FIG. 7 shows a block diagram illustrating one embodiment of a device for determining mobility of inversion charges at an interface surface between a semiconductor substrate and a deposited layer, preferably a dielectric layer.

FIG. 7 shows a block diagram illustrating one embodiment of a device for determining mobility of inversion charges at an interface surface between a semiconductor substrate and a deposited layer, preferably a dielectric layer. The device may be used to perform a method illustrated in FIG. 6. The device 80 comprises a substrate holder 82 configured to hold a substrate comprising at least one deposited layer. The device 80 may further comprise an applying module 84 configured to apply a corona charge onto the deposited layer of the substrate, the applying module being designed to at least locally induce a surface voltage Vs on a specific area. The device 80 may further comprise a determining module 86 configured to determine a parameter indicative of the surface voltage. The device 80 may further comprise an illuminating module 88 configured to illuminate locally the surface of the deposited layer comprising the deposited layer and in particular the specific area to create an illuminated spot. The device 80 may further comprise a measuring module 92 configured to measure the photovoltage inside and outside the defined illuminated spot. The device 80 may further comprise a calculating module 94 configured to calculate a parameter indicative for the sheet resistance based on the measured photovoltage, the parameter being indicative of the mobility of the inversion charges at the interface surface of a substrate and a deposited layer.

In one embodiment, the applying module 84 applies charge over the entire top surface of the at least one dielectric material by passing a metallic wire over the wafer, the wire being preferably at a fixed voltage e.g. 10 kV, in order to create corona charges on such dedicated area. In another embodiment, the applying module 84 applies charge locally on a dedicated area by using locally a corona jet, which blows corona charges on the top surface of the at least one dielectric material locally of the substrate in order to create corona charges on the dedicated area.

In one embodiment, the determining module 86 is configured to measure the surface voltage (Vs) contactless using a Kelvin probe.

In one embodiment, the illuminating module 88 comprises a laser which is used to create pulses to induce electron-hole pairs in the substrate underneath the deposited layer.

In one embodiment the measuring module 92 measures the photovoltage inside and outside the illuminated spot by using two at least partly concentric electrodes using the Junction Photo Voltage principle wherein the first electrode is situated within the illuminated spot and the second electrode is situated outside the illuminated spot. The two electrodes may be linear electrodes. The two electrodes may be at least partly concentric. In one example, the two electrodes are ring electrodes.

Although systems and methods as disclosed, is embodied in the form of various discrete functional blocks, the system could equally well be embodied in an arrangement in which the functions of any one or more of those blocks or indeed, all of the functions thereof, are realized, for example, by one or more appropriately programmed processors or devices.

EXAMPLE 1

Calculation of the mobility of inversion charge carriers at the interface surface of a Si substrate and a $HfO_2$ gate dielectric compared to the mobility of inversion charge carriers at the interface surface of a Si substrate and a $SiO_2$ gate dielectric.

FIG. 2 shows a general JPV curve in function of surface voltage on a 4 nm $SiO_2$ gate dielectric. The curve illustrates $V_1/V_2$ in function of the vertical electric field over the gate dielectric on a p-type Si substrate. It shows a peak due to the depletion region, in which very low free carrier concentration is available at the interface surface. At left from the peak resistivity is low due to free hole conduction in accumulation. At right from the peak free electron in the inversion layer control the sheet resistivity.

FIG. 3 shows a JPV curve in function of surface voltage for a 4 nm $SiO_2$ and for a 4 nm $HfO_2$ deposited on a p-type silicon substrate. FIG. 3 is obtained from measurements of a $SiO_2$ gate dielectric and a $HfO_2$ gate dielectric which were deposited on a p-type Si substrate, with same clean preparation and same dopant concentration. The JPV measurements were done with the same laser pulse frequency and laser intensity. Within these conditions it is possible to make comparison between measurements. $V_1/V_2$ is measured in function of surface bias in inversion. The inversion charge shows clearly a lower Rs for $SiO_2$ than for $HfO_2$. This shows that the mobility is higher for a $SiO_2$ gate dielectric material than for a $HfO_2$ gate dielectric material. The sheet resistance (Rs) shows a minimum in the curve which indicates that there is a maximum mobility at a certain gate dielectric field, which is also measured in transistors. The similarities with transistors show this is a promising technique to measure mobility of the inversion layers at the interface surface formed by (gate) dielectric and silicon substrate. This also means that this technique can provide indirectly information on the interface quality obtained for certain process conditions.

The foregoing description details certain embodiments. It will be appreciated, however, that no matter how detailed the foregoing appears in text, the method may be practiced in many ways. It should be noted that the use of particular terminology when describing certain features or aspects should not be taken to imply that the terminology is being re-defined herein to be restricted to including any specific characteristics of the features or aspects with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention.

EXAMPLE 2

Evaluation of the Measurement Technique

As an evaluation of the measurement technique, it was subjected to a measurement test of gate dielectrics for which one knows what mobility degradation they show relatively compared to each other. 300 mm p-Si wafers were processed as presented in Table 1. The gate dielectrics are chosen as such they have a same range of equivalent oxide thickness.

TABLE 1

| overview wafers, 2 replicas each | | |
|---|---|---|
| wafer nr | gate dielectric | EOT (nm) |
| 1, 2 | SiO2 | 5.1 |
| 3, 4 | SiON | 4.3 |
| 5, 6 | HfSiO | 4.4 |
| 7, 8 | HfSiON | 6.7 |

The $SiO_2$ is a thermal oxide grown in a Radiance process chamber from Applied Materials. HfSiO is deposited in a MOCVD process chamber from Applied Materials. Nitridation is done by inductively decoupled plasma in a DPN process chamber from Applied Materials. These processes are typically used for gate dielectric formation in integration CMOS flows, and all dielectrics got a forming gas anneal as last process.

It is generally known that $SiO_2$ has better mobility than HfSiO. It is also known that too high nitridation results in mobility degradation. The nitridation process was therefore chosen to be very hard in order to give an overdose of nitrogen. For the gate dielectrics we know maximum mobility in function of electric field is ordered as follows:

$$\mu_{SiO2} > \mu_{HfSiO}$$

$$\mu_{SiO2} > \mu_{SiON}$$

$$\mu_{HfSiO} > \mu_{HfSiON}$$

Figure 5:
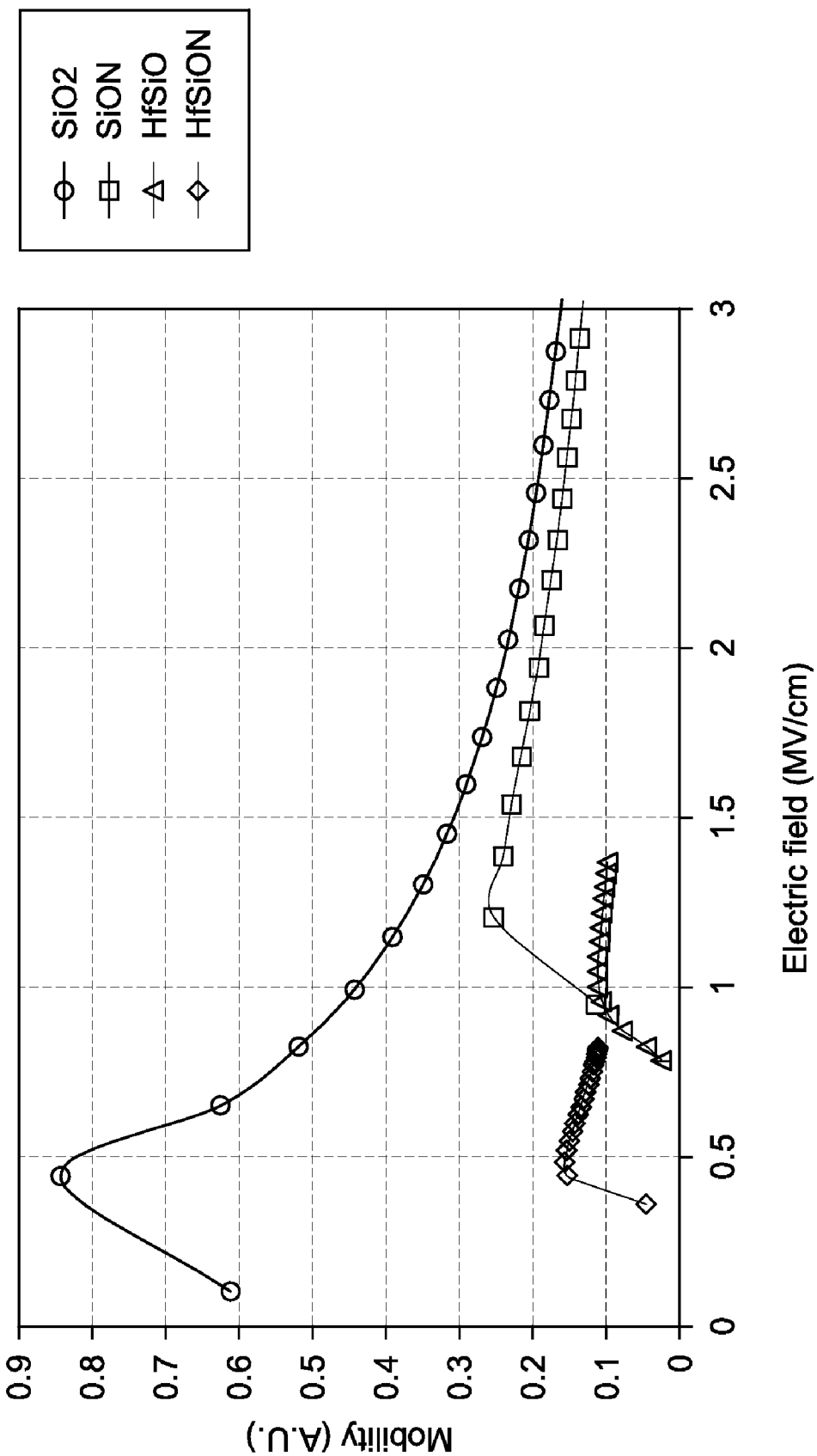
FIG. 5 illustrates mobility curves in function of electric field over the gate dielectric.

The resulting curves show typical mobility curves with a maximum in function of the electric field over the gate dielectric, as shown in FIG. 5. These maximum mobility values for all wafers are also shown in FIG. 5.

The resulting maximum mobility values are ordered as $\mu SiO_2 > \mu SiON > \mu HfSiO > \mu HfSiON$, in agreement with the expectations as defined above. This confirms the described measurement method works.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of determining mobility of inversion charge carriers situated at an interface surface between at least one layer of a dielectric material and a top surface of a semiconductor substrate, the method comprising:
providing a semiconductor substrate with a top surface whereon at least one layer of a dielectric material is deposited thereby forming an interface surface between the semiconductor substrate and the at least one layer of the dielectric material and a top surface of the at least one dielectric material;
applying a charge on a dedicated area of the top surface of the at least one dielectric material;
measuring a voltage Vs on the top surface of the at least one dielectric material;
illuminating the dedicated area to define an illuminated spot;
measuring during the illumination of the area the photovoltage inside and outside the defined illuminated spot; and
determining the mobility of the inversion charge carriers, situated at the interface surface and influenced by the at least one dielectric layer, by determination of the sheet resistance from the photovoltage measurement as being inversely proportional to the mobility.

2. The method according to claim 1, wherein the charge applied to the dedicated area is a corona charge applied over the entire top surface of the at least one dielectric material.

3. The method according to claim 1, wherein the substrate is a flat substrate and is doped to obtain a p-doped or n-doped substrate.

4. The method according to claim 1, wherein the substrate is a silicon (Si) or germanium (Ge) wafer.

5. The method according to claim 1, wherein the at least one dielectric layer is a gate dielectric layer or a combination of gate dielectric layers.

6. The method according to claim 1, wherein the at least one dielectric layer is a high-k dielectric.

7. The method according to claim 1, wherein an extra layer and preferably a capping layer is deposited on top of the at least one dielectric layer and/or a nitridation process is applied to the at least one dielectric layer.

8. The method according to claim 1, wherein the charge is applied over the entire top surface of the at least one dielectric material by passing a metallic wire over the water, the wire being preferably at a fixed voltage, in order to created corona charges on such dedicated area.

9. The method according to claim 1, wherein the charge is applied locally on a dedicated area by using locally a corona jet, which blows corona charges on the top surface of the at least one dielectric material locally of the substrate in order to create corona charges on the dedicated area.

10. The method according to claim 1, wherein the measuring of the surface voltage (Vs) is performed contactless using a Kelvin probe.

11. The method according to claim 1, wherein the measuring of the photovoltage inside and outside the illuminated spot is performed using two at least partly concentric electrodes using the Junction Photo Voltage principle wherein the first electrode is situated within the illuminated spot and the second electrode is situated outside the illuminated spot.

12. The method according to claim 11, wherein the two electrodes are linear electrodes.

13. The method according to claim 12, wherein the two electrodes are at least partly concentric.

14. The method according to claim 12, wherein the two at least partly concentric electrodes are ring electrodes.

15. The method according to claim 1, wherein the mobility is measured as a function of the temperature.

16. The method according to claim 1, wherein the mobility is measured as a function of the mechanical stress.

17. A device for determining mobility of inversion charges at an interface surface between a semiconductor substrate and a deposited layer, preferably a dielectric layer, the device comprising:
a substrate holder configured to hold a substrate comprising at least one deposited layer;
an applying module configured to apply a corona charge onto the deposited layer of the substrate, the applying module being designed to at least locally induce a surface voltage Vs on a specific area;
a determining module configured to determine a parameter indicative of the surface voltage;
an illuminating module configured to illuminate locally the surface of the deposited layer comprising the deposited layer and in particular the specific area to create an illuminated spot;

a measuring module configured to measure the photovoltage inside and outside the defined illuminated spot by measuring the voltage of a first and second partly concentric electrodes situated within and outside the illuminated spot respectively; and a calculating module configured to calculate a parameter indicative for the sheet resistance based on the measured photovoltage, the parameter being indicative of the mobility of the inversion charges at the interface surface of a substrate and a deposited layer.

18. A device for determining mobility of inversion charge carriers situated at an interface surface between at least one layer of a dielectric material and a top surface of a semiconductor substrate, the device comprising:

means for providing a semiconductor substrate with a top surface whereon at least one layer of a dielectric material is deposited thereby forming an interface surface between the semiconductor substrate and the at least one layer of the dielectric material and a top surface of the at least one dielectric material;

means for applying a charge on a dedicated area of the top surface of the at least one dielectric material;

means for measuring a voltage Vs on the top surface of the at least one dielectric material;

means for illuminating the dedicated area to define an illuminated spot;

means for measuring during the illumination of the area the photovoltage inside and outside the defined illuminated spot; and means for determining the mobility of the inversion charge carriers, situated at the interface surface and influenced by the at least one dielectric layer, by determination of the sheet resistance from the photovoltage measurement as being inversely proportional to the mobility.

* * * * *